United States Patent
Pedoeem et al.

(10) Patent No.: US 7,111,674 B2
(45) Date of Patent: Sep. 26, 2006

(54) HEAT DISSIPATING HOUSING WITH INTERLOCKING CHAMFERS AND ESD RESISTANCE

(75) Inventors: Albert Pedoeem, West Orange, NJ (US); Willie Ernst Braun, Franklin Lakes, NJ (US); Lang Yuan, Pearl River, NY (US); Corey M. Dayton, Newburgh, NY (US); Steven M. Cherry, Edmond, OK (US)

(73) Assignee: Fujitsu Limited, Kanagawa (JP)

( * ) Notice: Subject to any disclaimer, the term of this patent is extended or adjusted under 35 U.S.C. 154(b) by 48 days.

(21) Appl. No.: 10/634,909

(22) Filed: Aug. 6, 2003

(65) Prior Publication Data

US 2005/0028967 A1    Feb. 10, 2005

(51) Int. Cl.
*F28F 7/00*    (2006.01)

(52) U.S. Cl. ............... 165/185; 165/80.3; 361/697; 174/16.3; 257/707

(58) Field of Classification Search .............. 165/185, 165/80.3, 104.33, 80.4, 107.21; 361/711, 361/697, 702; 257/706, 722
See application file for complete search history.

(56) References Cited

U.S. PATENT DOCUMENTS

| | | | | |
|---|---|---|---|---|
| 3,268,772 A | * | 8/1966 | Hiroshi et al. ............... 361/711 |
| 3,327,776 A | * | 6/1967 | Butt ........................... 165/80.4 |
| 4,504,156 A | * | 3/1985 | Currie et al. .................. 374/45 |
| 4,628,992 A | * | 12/1986 | Kennedy ..................... 165/123 |
| 4,656,559 A | * | 4/1987 | Fathi .......................... 361/721 |
| 4,884,168 A | * | 11/1989 | August et al. ............... 361/702 |
| 5,287,244 A | * | 2/1994 | Hileman et al. ............. 361/687 |
| 5,742,478 A | * | 4/1998 | Wu ............................. 361/704 |
| 5,949,640 A | * | 9/1999 | Cameron et al. ............ 361/600 |
| 6,029,742 A | * | 2/2000 | Burward-Hoy ............. 165/80.4 |
| 6,046,908 A | * | 4/2000 | Feng ........................... 361/707 |
| 6,144,556 A | * | 11/2000 | Lanclos ....................... 361/695 |
| 6,157,538 A | * | 12/2000 | Ali et al. ..................... 361/704 |
| 6,305,463 B1 | * | 10/2001 | Salmonson ................. 165/80.3 |
| 6,411,514 B1 | * | 6/2002 | Hussaini ..................... 361/704 |
| 6,504,719 B1 | * | 1/2003 | Konstad et al. ............. 361/698 |
| 6,696,755 B1 | * | 2/2004 | Kami et al. ................. 257/728 |
| 6,788,540 B1 | * | 9/2004 | Kruger et al. .............. 361/719 |

* cited by examiner

*Primary Examiner*—Terrell McKinnon
(74) *Attorney, Agent, or Firm*—Bingham McCutchen LLP

(57) ABSTRACT

A system is designed to facilitate heat transfer via radiation, convection and conduction from components within the system to the external environment and housing. The system includes a thermally conductive plate positioned between a surface of the housing and one or more heat generating components within the housing. A compliant thermally conductive material may then be placed between the heat generating components and the plate to facilitate conductive heat transfer from the component to the plate. From the plate, heat is transferred to the external environment through radiation and convection of air through perforations in the housing which cover a substantial portion of the surface area of the housing. The housing may also be inexpensively manufactured through stamping and may include two mating pieces which interlock using chamfered electrostatic discharge fingers. The housing may also incorporate a metal shroud for enveloping certain ESD sensitive connectors, such as optical couplers.

13 Claims, 4 Drawing Sheets

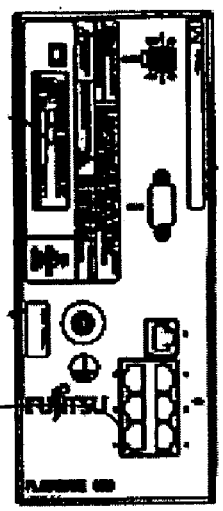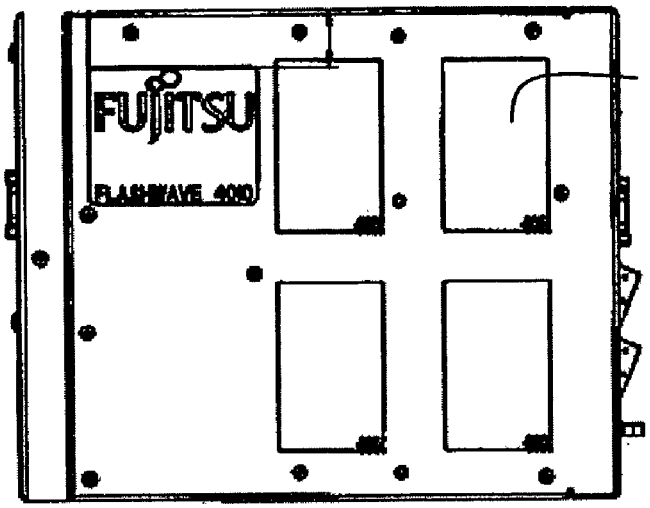
FIGURE 3A  FIGURE 3B

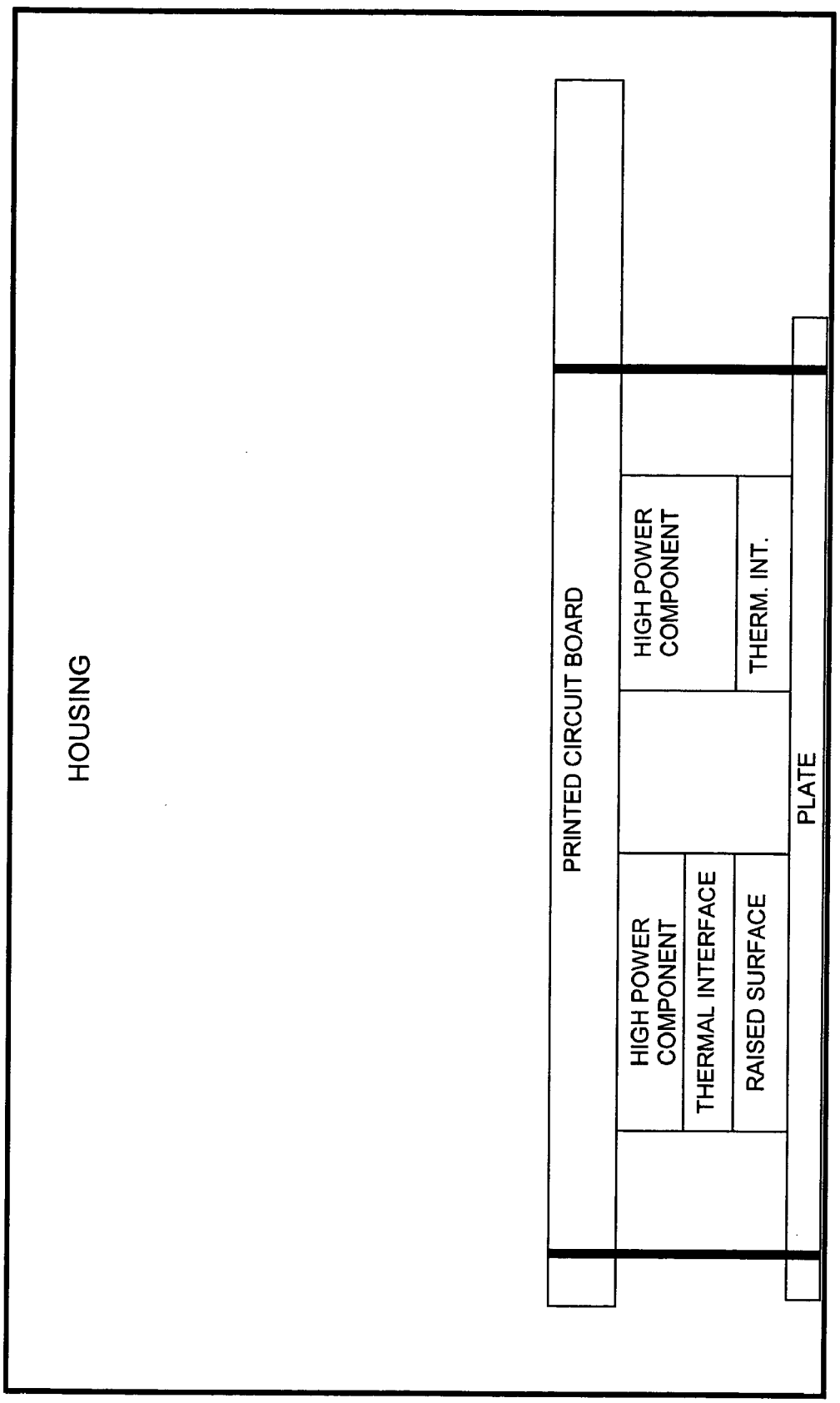

HEAT DISSIPATING HOUSING WITH INTERLOCKING CHAMFERS AND ESD RESISTANCE

FIELD OF THE INVENTION

The present invention relates generally to housings for electrical systems and, more particularly, to housing systems that are inexpensive and easy to assemble and that include features that facilitate heat dissipation through the housing to the external environment.

BACKGROUND OF THE INVENTION

Design and manufacturing technology for electronic and optical components has advanced and continues to advance in miniaturization, density, function and performance. As a result, today's devices and systems incorporate a large amount of functionality into a small amount of space. Examples of this are laptop computers, servers, switches and other small form factor devices and systems. These systems must be kept from overheating by dissipating heat to the surrounding environment. Some components within the systems must also be given special attention either because they generate more heat than the others or because they exhibit more sensitivity to temperature changes and therefore must be kept cooler than other components. Examples of these components may include microprocessors, optical transceivers, power converters and many other components.

Conventionally, components within a system which generate large amounts of heat are cooled by mounting a heat sink on the components themselves. In addition, fans are frequently implemented within the housing of a system to improve airflow within the system and facilitate dissipating heat to the outside environment.

Fans are problematic, however, because they are not reliable and present a single point of failure. When a fan fails, a system may overheat thus damaging or destroying the system itself. Heat sinks which are used within the housing of a system also present problems. First, depending on their construction and the materials used, they may be expensive and also heavy. In addition, heat sinks present various other disadvantages depending on the way in which they are mounted within the system. When adhesives and clips are used to mount heat sinks to components, the attachment may not be stable or reliable and may not be well suited to certain applications. In addition, when heat sinks are mounted on a printed circuit board, posts or standoffs may be required which may block wiring channels and take up valuable space on the substrate that could be used for other purposes.

Accordingly, there is a need for a technique for dissipating heat from within a system to the surrounding environment that does not require a fan within the system and that does not require expensive and bulky heat sinks within the interior of the system. There is a further need for inexpensive techniques to remove heat from within a system and components of the system. There is a further need for systems that have housings that are easy to assemble and disassemble, that are efficient at eliminating heat and that include features for preventing electrostatic discharge damage to components within the system.

SUMMARY OF THE INVENTION

According to an embodiment of the present invention, a system is designed to facilitate heat transfer via radiation, convection and conduction from components within the system to the external environment and housing. The system includes a thermally conductive plate positioned between a surface of the housing and one or more heat generating components within the housing. The plate may include raised areas for mating with heat generating components directly or through a pad comprising complaint, thermally conductive material. The housing may include perforations covering a substantial portion of its surface area to permit air to enter the housing and cool the plate and the interior of the housing. The housing may be made of a material with good heat conduction properties, such as aluminum, and may be thermally coupled to certain temperature sensitive components within the housing for temperature regulation. The housing may be inexpensively manufactured through stamping and may include two mating pieces which interlock using chamfered and dimpled electrostatic discharge fingers. The housing may also incorporate a metal shroud for enveloping certain ESD sensitive connectors, such as optical couplers.

According to one embodiment of the present invention, a system for communications includes a housing, a printed circuit board and a thermal plate. The housing has air flow perforations over more than half of at least one surface. The printed circuit board includes at least one component and the thermal plate is in contact through a thermally conductive and complaint pad to at least one component. The thermal plate may include at least one raised portion to facilitate thermal contact between the thermal plate and a corresponding component.

According to another embodiment of the present invention, a method of manufacturing a communications system includes positioning high power components on one side of a printed circuit board, providing a thermal plate thermally coupled to the high power components and providing a housing. The housing having perforations covering a substantial portion of its surfaces to permit exchange of heat through the perforations to the surrounding environment. According to the method, temperature sensitive components are positioned on the opposite side of the printed circuit board from the thermal plate and may be thermally coupled to the housing. The temperature sensitive component may be an optical component. The optical component may include an optical transceiver that is grounded and that is protected by a metal shroud in the housing.

BRIEF DESCRIPTION OF THE FIGURES

The above described features and advantages of various embodiments of the invention will be more fully appreciated with reference to the attached drawings and detailed description.

FIGS. 3A and 3B depict a rear and side view of an assembled housing according to an embodiment of the present invention.

FIG. 5 depicts a functional block diagram of an interface between a thermal plate and components on a printed circuit board according to an embodiment of the present invention.

DETAILED DESCRIPTION

According to an embodiment of the present invention, a system is designed to facilitate heat transfer via radiation, convection and conduction from components within the system to the external environment and housing. The system includes a thermally conductive plate positioned between a surface of the housing and one or more heat generating components within the housing. The plate may include raised areas for mating with heat generating components directly or through a pad comprising complaint, thermally conductive material. The housing may include perforations covering a substantial portion of its surface area to permit air to enter the housing and cool the plate. The housing may be made of a material with good heat conduction properties, such as aluminum, and may be thermally coupled to certain temperature sensitive components within the housing for temperature regulation. The housing may be inexpensively manufactured through stamping and may include two mating pieces which interlock using chamfered electrostatic discharge fingers. The housing may also incorporate a metal shroud for enveloping certain ESD sensitive connectors, such as optical couplers.

The Housing

Figure 1:
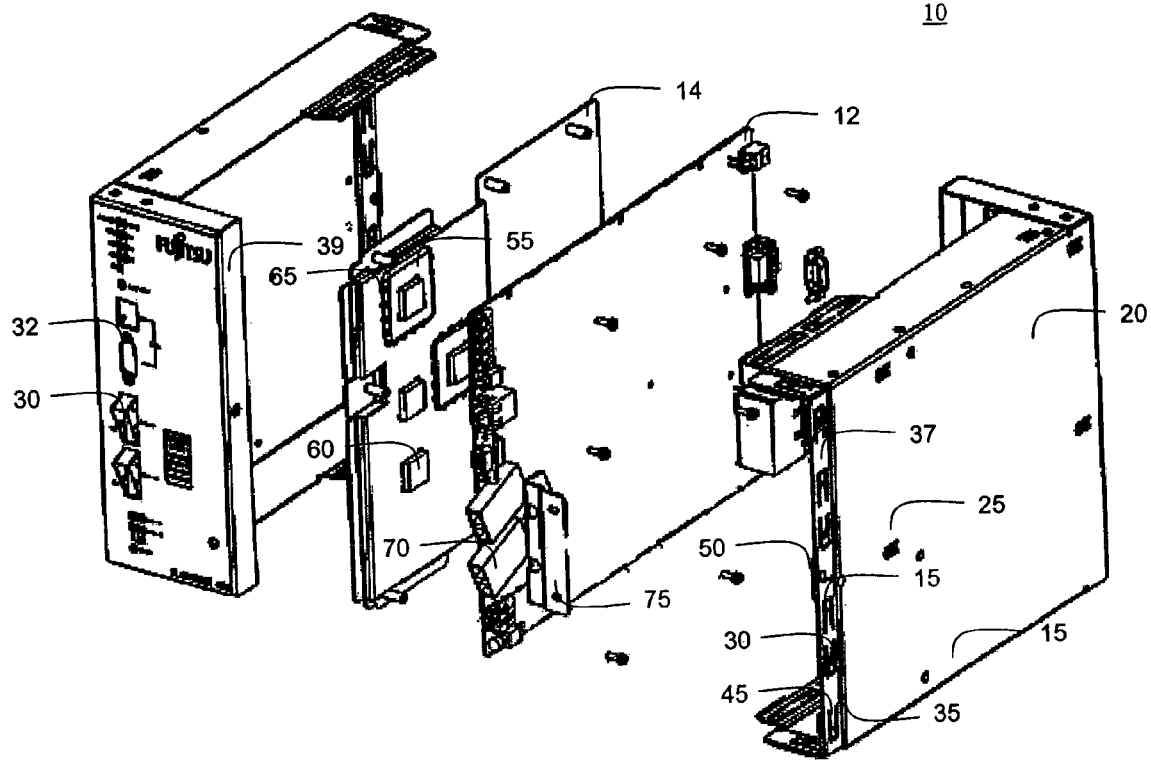
FIG. 1 depicts an exploded view of a housing with mating halves, an internal heat sink and a printed circuit board according to an embodiment of the present invention.
Figure 2:
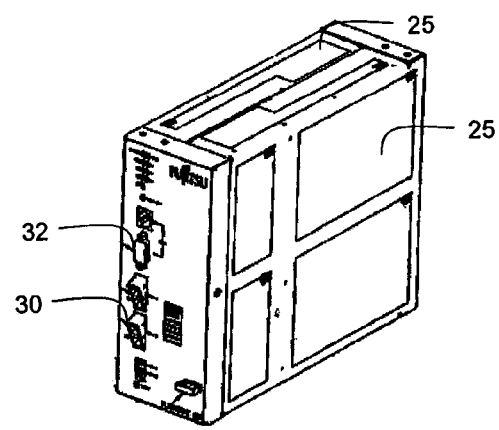
FIG. 2 depicts an isometric frontal view of an assembled housing according to an embodiment of the present invention.

FIG. 1 depicts an exploded view of an optical communications system 10 known as the FLASHWAVE 4010™. It will be understood, however, that the housing and system according to the present invention may be used to implement any communications or other system. The FLASHWAVE 4010™ system may be used to implement a synchronous optical network (SONET) communications system. The system may assume any of several configurations including a housing having seven DS1 connections and unprotected OC-3 connections; seven DS1 connections and protected OC-3 connections; three DS3 connections and unprotected OC-3 connections; and three DS3 connections and protected OC-3 connections. The system may be interoperable with other standards-based equipment, including other SONET platforms and TELCORDIA™ standards. The system may be optimized for simplicity, small size, low cost and flexibility and may be designed for grooming network traffic for OC-3 and OC-12 access rings. The system also delivers a simple, low-cost Ethernet transport solution through direct Ethernet interfaces to local area network (LAN) equipment.

Referring to FIG. 1, the system 10 includes a housing 15, a thermal plate 14, a printed circuit board 12 and a heat sink 75. The housing 15 includes a plurality of holes 32 for interfacing cables to connectors positioned on the printed circuit board 12. The thermal plate 14, printed circuit board 12 and heat sink 75 are all coupled to the housing 15.

According to one embodiment of the invention, the housing 15 comprises a box made of a material that conducts heat well, such as the metal aluminum. It will be understood, however, that the material of the housing may be any convenient material. The housing includes perforations comprising arrays of holes covering a substantial portion of the surfaces. The holes are preferably approximately 2 millimeters in diameter and facilitate airflow into the interior of the housing. The holes are also small enough that they retard the spread of fire in the event of an internal fire within the housing.

The housing may include perforations 25 on all of its surfaces. The perforations may cover more than fifty percent of one of the surfaces and more than 25 percent of the other surfaces. However, some of the surfaces may include no perforations. In general, the housing may include perforations covering a substantial portion of the box and a substantial portion of surfaces that will be exposed to the air after mounting of the housing.

To facilitate assembly of the system, the housing 15 may comprise two mating parts that together comprise the housing. Each of the mating parts may include mating surfaces that are designed to provide alignment during assembly and tight coupling between the two mating parts after assembly. Referring to FIG. 1, each mating part includes two types of mating surfaces, a dimpled mating surface and a rigid mating surface. The dimpled mating surface 37 on one mating half of the housing engages the opposing rigid mating surface 39 on the other half of the housing.

The dimpled mating surface 37 has a chamfer 35 relative to the surface of the housing. It is substantially flat but includes at least one dimpled member 40 formed in the surface. The dimpled member includes a portion that is raised and spring biased relative to the flat surface. The raised portion 40 may be substantially continuous relative to the surrounding surface or may be attached to the surrounding surface via a finger 45. The dimpled mating surface 37 may further include at least one chamfered edge 50 at a distal portion.

The rigid mating surface 39 is a substantially flat surface that forms part of the outer wall of the box. During assembly of the housing, the mating parts of the housing are brought together. The chamfered edge 50 of the dimpled mating surfaces 37 from each mating part first engages the rigid surface 39 of the other mating part. The chamfered edges 50 guide the mating parts together and cause the dimpled mating surfaces to move within the interior of the housing as the mating parts are joined together. As the mating surfaces are fully joined together, the dimpled mating surfaces 37 are positioned fully within the housing. The dimpled members 40 of the dimpled mating surfaces 37 press against the rigid mating surfaces 39 and tend to tightly hold the mating parts together. One or more screws may be used to hold the mating parts together in the assembled position. Upon assembly with the mating surfaces in place, the housing enclosure creates a cage with desirable electromagnetic interference (EMI) properties.

Both mating parts of the housing may be manufactured inexpensively using stamped aluminum. The perforations, holes for connectors, chamfered edges, dimpled members and holes for screws or other fasteners may all be formed by stamping metal. For this purpose, sheets of aluminum may be used as the metal. The stamped aluminum sheets may than be bent and assembled into each of the mating housing parts. The dimpled members may be formed so that they are raised relative to the dimpled mating surface. One configuration for the dimpled member is a cup stamped in the dimpled mating surface where the height of the cup is approximately the housing wall thickness.

The Printed Circuit Board and Thermal Plate

The printed circuit board may be any printed circuit board. Generally, the printed circuit board is a multi-layer board for mounting a variety of electronic components and connectors that comprise the electrical system mounted within the housing.

The printed circuit board includes at least one component that dissipates a substantial amount of heat, or at least more heat than other components of the system. These relatively high power components may include processors, optical components and other devices which generate a substantial amount of heat. According to one embodiment of the invention, most if not all of the components that generate a substantial amount of heat are mounted on the same side of the printed circuit board 12. The other components which generate less heat are mounted on the other side of the printed circuit board.

A thermal plate 14 is then brought into thermal contact with the heat generating components mounted on the same side of the printed circuit board 12. In order to ensure proper thermal contact between the thermal plate 14 and the heat generating components, several steps may be taken. First, raised portions 55 or surfaces may be formed on the thermal plate 14. Each raised portion 55 on the thermal plate 14 is raised to correspond to the height of a corresponding heat generating component of the printed circuit board 12. In this manner, a substantially flat thermal plate includes raised regions that allow it to contact multiple components of a printed circuit board that may vary in height relative to the plane of the printed circuit board and the plane of the thermal plate.

In addition to the raised portions of the thermal plate 12, thermally conductive pads 60 may be applied to the thermal plate, either on a raised portion or on a flat portion. The pads are thermally conductive and compliant. The pads give extra flexibility to account for differences in height among components of the board and also to facilitate conductive heat transfer from each component to the thermal plate. The compliant, thermally conductive pad may be any form of heat conductive pad. Suitable material for the pad includes metallic or ceramic filled elastomers available from Chomerics North America or Fujipoly America Corporation.

To facilitate the inexpensive manufacture of the system 10, the thermal plate may be manufactured of an inexpensive conductive material. According to one embodiment of the present invention, the thermal plate may be a metal, such as aluminum. It may further be manufactured inexpensively through stamping. To facilitate making the raised portions of the thermal plate through the stamping process, holes 65 may be stamped into the metal thermal plate that surround the raised portion of the thermal plate. The holes facilitate creating a greater degree of height between the surface of the thermal plate and the surface of the raised portion of the thermal plate. It will be understood that any heat conducting material may be used for the thermal plate, including non-metals, and any manufacturing technique may be used to form the plate.

The thermal plate 14 may be joined to the printed circuit board 12 by mounting posts 80 and screws 85. Alternatively, screws, rivets or any other fastening technique may be used to hold the thermal plate in operative relationship with the printed circuit board. The thermal plate 14 may be joined to the printed circuit board 12 or to one of the mating housing parts.

FIG. 5 depicts a functional block diagram of an interface between a thermal plate and components on a printed circuit board according to an embodiment of the present invention. Referring to FIG. 5, it is apparent that each heat generating component may make contact to the thermal plate through a thermally conductive, compliant pad. The pad may be mounted directly on the thermal plate at a flat or a raised portion thereof.

By laying out the printed circuit board with all heat generating components on the same side, the heat from relatively high power components may be efficiently channeled to the thermal plate through conductive heat transfer. The heat may then be exchanged effectively to the surrounding environment through the air which enters the housing through the perforations 25 and flows over the thermal plate 14. For relatively compact housings, the housing may accommodate a system that dissipates up to about 30 to 40 watts of power, while accommodating temperature sensitive components within the housing, without using a fan. The amount of power dissipation may exceed 30–40 Watts when the temperature ratings of the most sensitive components of the system allow it.

Heat Sink for Temperature Sensitive Components

While most heat generating components are mounted on the thermal plate side of the printed circuit board, there may be other components of the system that need to be coupled to a heat sink. According to one embodiment of the present invention, an optical component 70 is sensitive to high temperatures and is therefore coupled to a heat sink. The optical component 70 is fastened to the opposite side of the printed circuit board 12 from the heat generating components. The optical component(s) are also fastened at the edge of the printed circuit board close to the connector for providing an optical interface external to the system.

Figure 4A:
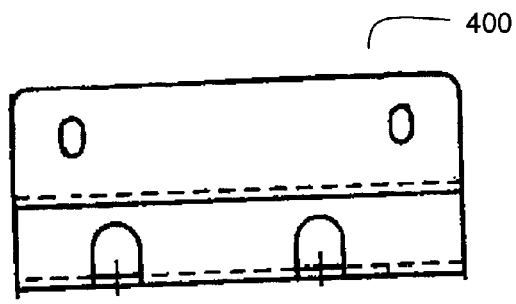
FIGS. 4A–4C depict front, top and isometric views of a heat sink according to an embodiment of the present invention.
Figure 4B:
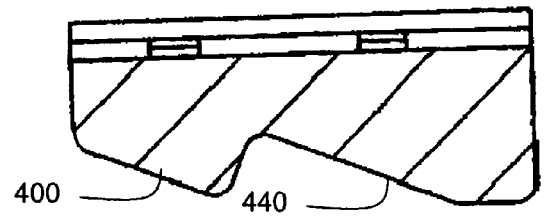
Figure 4C:
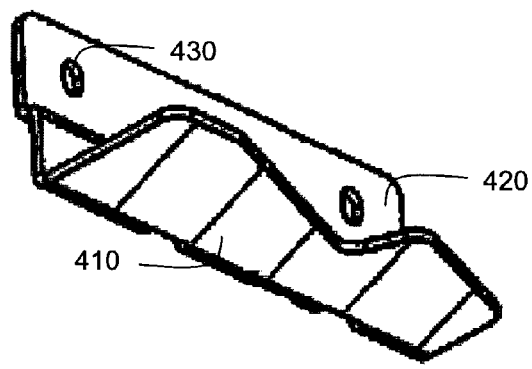

Because of its position, the optical component is not thermally coupled to the thermal plate. Instead, according to an embodiment of the present invention, a separate heat sink depicted in FIGS. 4A–4C is implemented to control the temperature of the optical component. In particular, the heat sink 400 is affixed to the optical components and one of the mating housing parts. During operation, the heat sink 400 provides a thermally conductive path between the optical component and the housing. The housing itself is then used to dissipate heat to the surrounding environment through radiation, conduction and convection and therefore regulates the temperature of the optical component.

The optical connectors and components may be positioned at angles to the surface of the housing as shown. The angle may facilitate connection of a cable to a connector. To accommodate the angle, the heat sink may include a side surface that connects directly to the housing and a lower surface that is positioned to make surface contact with the optical components.

Referring to FIGS. 4A–4C, the heat sink 400 includes a substantially flat lower surface 410 and a substantially flat side surface 420. The side surface is positioned approximately at a right angle to the lower surface. The heat sink may be made of any heat conducting material, including aluminum. The lower and upper surfaces have a thickness sufficient to convey heat along the heat sink from the lower surface to the upper surface. According to one embodiment, surfaces are between 60 and 125 mils thick. It will be understood, however, that any convenient thickness may be implemented.

The lower surface may include cutouts 440. The cutouts generally follow the contours of the optical components to which the heat sink is mounted in relation to the printed circuit board and the housing. Referring to FIG. 1, the optical components may be mounted at an angle relative to the printed circuit board. In this configuration, the edges of the optical components are positioned at angles to the edge of the printed circuit board and the housing. For this reason, the cutouts 440 are angular. In general, the cutouts 440 are not necessary but may be desirable depending on the placement and orientation of the components being cooled by the heat sink.

Figure 4D:
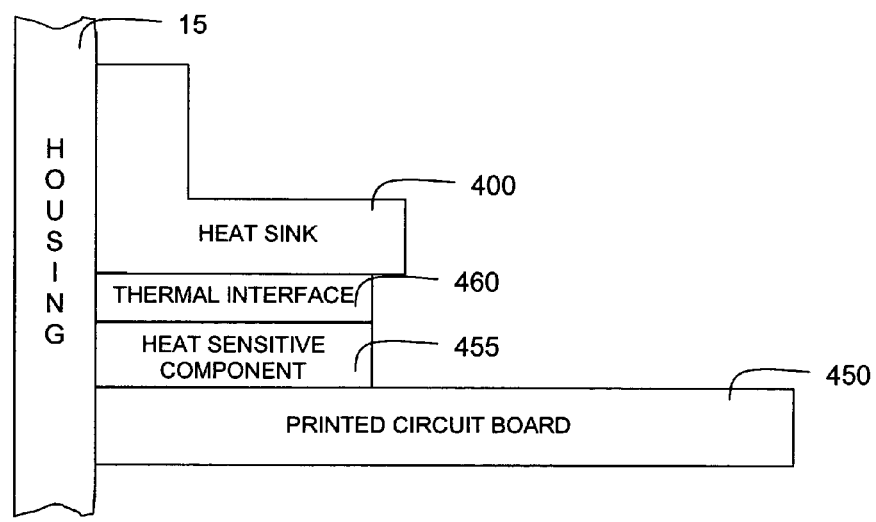
FIG. 4D depicts a functional block diagram of an interface between a housing, a heat sink and a temperature sensitive component according to an embodiment of the present invention.

FIG. 4D depicts a functional block diagram of the temperature coupling between the optical components, the heat sink and the housing. Referring to FIG. 4D, the printed circuit board 450 includes a heat sensitive component 455 mounted to the printed circuit board near one edge of the printed circuit board. The lower surface 410 of the heat sink 400 is positioned in thermal contact with the component 455 via a thermally compliant pad 460. The pad 460 may be made of the same material as the pad 60 described above and may be adhered to both the component 455 and the lower surface of the heat sink 400. In addition, the side surface 420 of the heat sink may be joined together with a surface of the housing 15 as shown. The heat sink may be joined with a fastener through the holes 430 in the side surface, which may be a screw, rivet, nail or any other fastener. Alternatively, the side surface 420 of the heat sink 400 may be adhered or welded to the housing.

When positioned as shown in FIG. 4D, during operation, the temperature sensitive component 455 exchanges heat through conductive heat transfer with the housing 15. Conductive heat transfer is very efficient and in this case has the effect of tending to regulate the temperature of the temperature sensitive component so that it stays relatively close in temperature to the housing temperature. Meanwhile, the other components on the printed circuit board which are not coupled to the thermal plate are cooled primarily by radiation and convection and may therefore reach higher temperatures than those that are cooled by the thermal plate.

ESD Features

Another feature of the housing is that it includes electrostatic discharge (ESD) protection for some connectors present in the system. Referring to FIG. 1, there are two optical connectors 70 present on the front face of the system. The optical connectors may include metal ferrules which are conventionally ungrounded. When this is the case, the connectors and optical components are vulnerable to ESD damage during handling of the housing and optical connectors.

In order to avoid or minimize damaging ESD effects, according to an embodiment of the present invention, a conductive shroud 30 is introduced that protrudes through the housing. The shroud is implemented in a conductive material, such as sheet metal and may include dimples on interior surfaces. The dimples physically and electrically connect the housing to the optical transceiver and to the metal ferrule. As a result, charge applied to connector or the metal ferrule is immediately distributed to the case and carried to the ground potential and is not deposited in the optical component. This minimizes the ESD impact of handling the system on the optical component and connectors.

While particular embodiments of the present invention have been shown and described, it will be understood by those having ordinary skill in the art that changes may be made to those embodiments without departing from the spirit and scope of the invention.

What is claimed is:

1. A system for communications, comprising:
   a housing having air flow perforations over more than half of at least one surface;
   a printed circuit board including at least one component on a first side of the printed circuit board and at least one optical component on a second side of the printed circuit board;
   a heat sink in thermal contact with the optical component and the housing, the heat sink conducting heat from the optical component to the housing; and
   a thermal plate coupled between the at least one surface of the housing and the printed circuit board, the thermal plate being in thermally conductive contact with the at least one component and the housing.

2. The system according to claim 1, further comprising:
   at least one thermally conductive and compliant pad coupled between the thermal plate and the at least one component.

3. The system according to claim 2, wherein the thermal plate includes at least one raised portion, each raised portion being raised to facilitate thermal contact between each of the at least one raised portion and a corresponding one of the at least one component.

4. The system according to claim 3, wherein the thermal plate is aluminum and is manufactured by at least one of stamping and die casting.

5. The system according to claim 1,
   wherein the housing comprises mating halves, each mating half including a dimpled mating surface and a rigid mating surface, each dimpled mating surface engaging the opposing rigid mating surface,
   wherein the dimpled mating surface comprises at least one chamfer and at least one dimpled member for engaging the rigid surface.

6. The system according to claim 1, wherein the optical component includes a metal ferrule, further comprising:
   an optical transceiver having a grounded metal ferrule electrically coupled to the optical component; and
   a metal shroud coupled to the housing for surrounding the optical connector.

7. The system according to claim 6, wherein the metal shroud comprises dimples for electrically coupling the connector to the housing.

8. A method of manufacturing a communications system comprising:
   providing a printed circuit board having high power components on one side of the printed circuit board;
   providing a thermal plate to allow thermal conductive contact between the high power components and the thermal plate and the thermal plate and a housing;
   providing a temperature sensitive component on the opposite side of the printed circuit board from the thermal plate;
   thermally coupling the temperature sensitive component to the housing;
   providing a heat sink thermally coupled to the housing and the component to cause conductive heart transfer between the temperature sensitive component and the housing; and
   providing the housing with perforations covering a substantial portion of its surfaces to permit exchange of heat through the perforations to the surrounding environment;
   wherein the thermal plate is positioned between the housing and the printed circuit board.

9. The method according to claim 8, wherein the temperature sensitive component is an optical component.

10. The method according to claim 9, wherein the optical component is coupled to an optical transceiver on the printed circuit board and wherein the optical transceiver is grounded.

11. The method according to claim 10, wherein the thermal plate is thermally coupled to each high power component through a thermally conductive and compliant pad.

12. The method according to claim 11,
wherein the housing includes mating halves, each mating half including a dimpled mating surface and a rigid mating surface, each dimpled mating surface engaging the opposing rigid mating surface,
wherein the dimpled mating surface comprises at least one chamfer and at least one dimple member for engaging the rigid surface.

13. The method according to claim 9, further comprising positioning a thermally conductive and compliant pad between the heat sink and the temperature sensitive component.

* * * * *